United States Patent [19]

Thoma

[11] Patent Number: 4,507,526

[45] Date of Patent: Mar. 26, 1985

[54] MODULE UNIT TIME SWITCH DISK ASSEMBLY

[75] Inventor: Fritz Thoma, Haslach, Fed. Rep. of Germany

[73] Assignee: Dieter Graesslin Feinwerktechnik, Fed. Rep. of Germany

[21] Appl. No.: 558,771

[22] Filed: Dec. 5, 1983

Related U.S. Application Data

[63] Continuation of Ser. No. 346,844, Feb. 8, 1982, abandoned.

[30] Foreign Application Priority Data

Feb. 9, 1981 [DE] Fed. Rep. of Germany ....... 3104535

[51] Int. Cl.[3] ....................... H01H 43/10; H02B 1/00; H05K 7/00

[52] U.S. Cl. ............................. 200/38 R; 200/38 FB; 200/38 BA; 361/357; 361/393

[58] Field of Search ................. 200/38 FB, 51 R, 307, 200/38 B, 38 BA, 38 C, 38 CA, 31 R; 361/357, 393

[56] References Cited

U.S. PATENT DOCUMENTS

| | | | |
|---|---|---|---|
| 2,978,553 | 4/1961 | Bundy et al. | 200/38 BA |
| 3,678,225 | 7/1972 | Hulterstrum | 200/38 BA |
| 3,821,502 | 6/1974 | Joeckel | 200/31 R X |
| 4,102,492 | 7/1978 | Gold et al. | 235/375 |
| 4,224,484 | 9/1980 | Haas et al. | 200/38 FB |

FOREIGN PATENT DOCUMENTS

| | | |
|---|---|---|
| 1283937 | 11/1968 | Fed. Rep. of Germany . |
| 1640944 | 12/1970 | Fed. Rep. of Germany . |
| 2291602 | 6/1976 | Fed. Rep. of Germany . |
| 2510486 | 9/1976 | Fed. Rep. of Germany . |
| 2835518 | 2/1980 | Fed. Rep. of Germany . |
| 8015245 | 9/1980 | Fed. Rep. of Germany . |
| G8107589 | 7/1981 | Fed. Rep. of Germany . |
| 8103233 | 11/1981 | World Intel. Prop. Org. . |

*Primary Examiner*—J. R. Scott

*Attorney, Agent, or Firm*—Hill, Van Santen, Steadman & Simpson

[57] ABSTRACT

Time switch is arranged on a plug-in unit for a system housing containing various side-by-side unit components. The time switch includes a rotatable timing disk disposed for rotation about a lateral axis longitudinal of the housing and having a circumferential portion exposed exterior of a front plate of the plug-in unit. The disk is circumferentially formed with time range scale markings and has adjustable switch riders attached along the circumference for selectively triggering control switch as the disk rotates.

9 Claims, 5 Drawing Figures

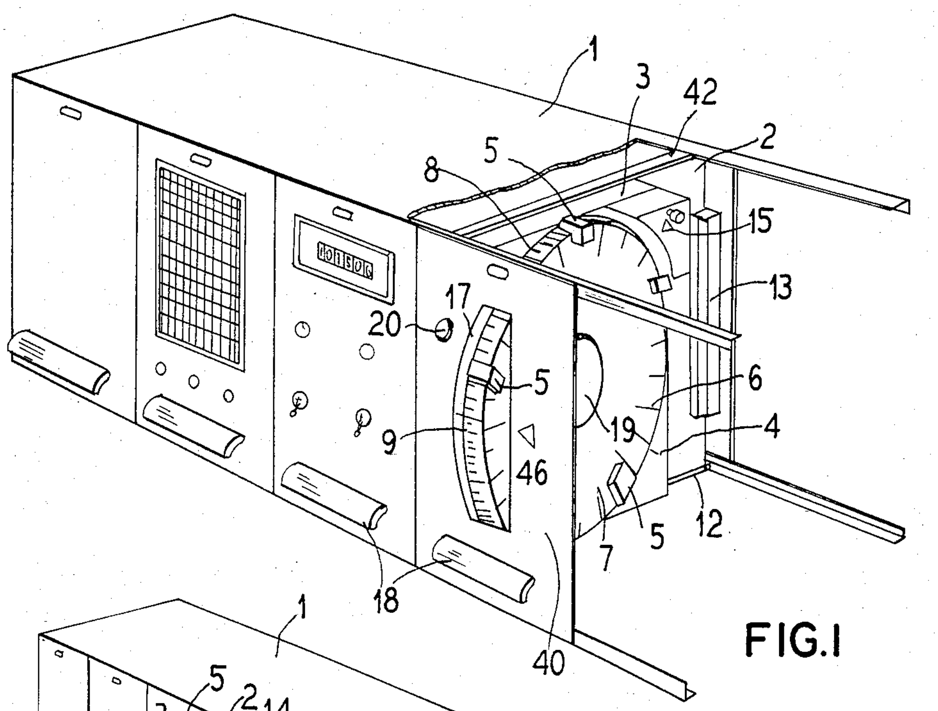
FIG. 1
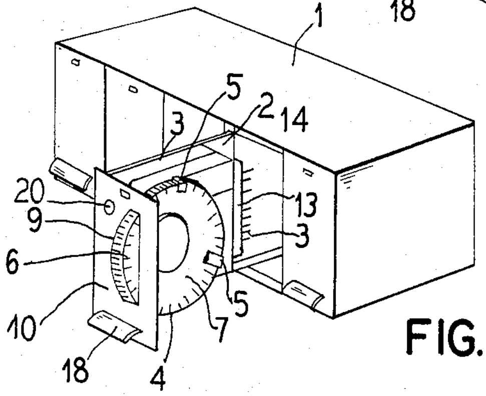
FIG. 2
FIG. 3
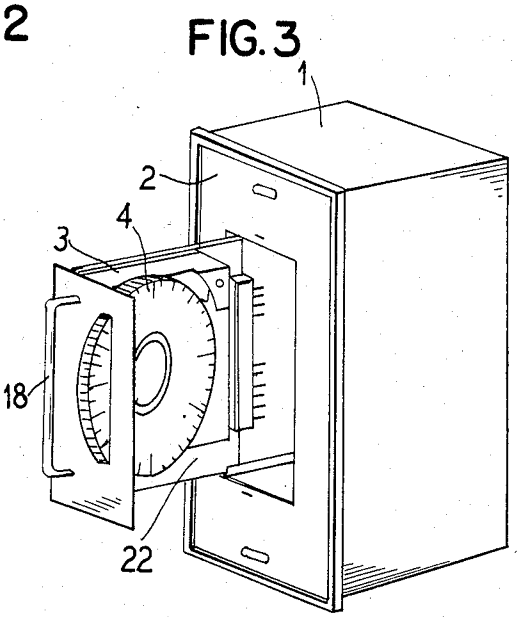
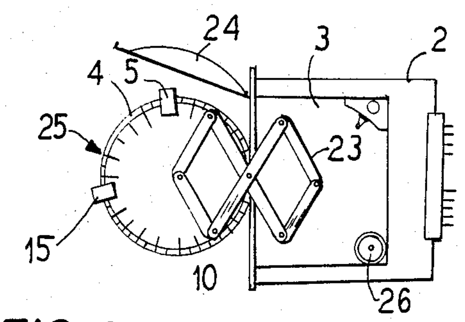
FIG. 4
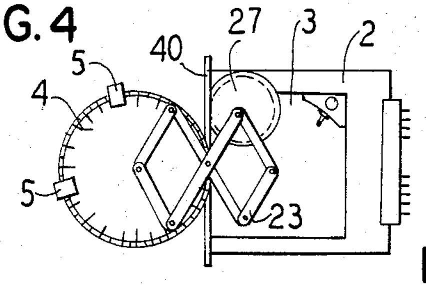
FIG. 5

MODULE UNIT TIME SWITCH DISK ASSEMBLY

This is a continuation of application Ser. No. 346,844, filed Feb. 8, 1982, now abandoned.

BACKGROUND OF THE INVENTION

The invention relates to a time switch means and, more particularly, a timing disk and a programming means on the timing disk in the form of selectively mounted switch riders for use in time switch means arranged as a modular unit for incorporation in component carrying time switch housings.

It is known to use time switch means such as, for example, switch clocks, time lag relays, or cycle control timers as plug-in units or removable front plates for insertion into system component carriers or other frames or housings, usually of standard dimensions like type DIN 4 1 494, a German standard for module carriers.

The front plates of such plug-in units provided may be formed of any desired width and usually must be a specific height. However, it is desirable that this width of the front plate should expediently be as small as possible, particularly 50 mm or less.

However, the spatial width of the front plate for known time switch plug in units, fixes the outside diameter of a timing disk, since the disks of these known units are typically rotatable about a vertical axis. Particularly given a front-side assembly arrangement of such a device, the timing disk would then be of a diameter 50 mm or smaller. For a programming scheme provided along the disk, for example, in the form of switch riders, the relatively small circumference would result in the fact that the switching time spacing between two switch riders in close proximity to one another would not afford sufficient free space for many uses, especially requiring distinct switch triggering in a short duration.

It is therefore an object of the invention to create a time switch means of a type adapted for plug-in modular mounting and to dispose the time switch means in such manner that a timing disk with programming, particularly in the form of adjustable switch riders, may be formed of the largest possible diameter enabling simplified reading and an expanded permissible extent of programming.

SUMMARY OF THE INVENTION

A timing disk which is provided at its circumference with a programming device in the form of adjustably mounted switch riders is disposed with a front or planar side perpendicular to the front plate, rotatable about a lateral axis in a system housing employing a time switch device. The timing disk exhibits an annular setting or time scale on its front or planar side about the circumferential side edge, both of which are visible from outside the housing at a portion of the disk projecting through an opening in the plate of the plug-in unit. For the purpose of programming or servicing the timing disk, the plug-in unit can be withdrawn together with the timing disk of the time switch means from the component carrier system housing.

The time switch means together with the timing disk and the programming means may be disposed as a one-piece plug-in unit; insertable into a housing opening conforming to standard housing dimensions and which, for servicing or, respectively, programming the timing disk, can be withdrawn from the housing along guide tracks provided in the frame of the housing.

In accordance with a further embodiment, only the timing disk together with its programming means is provided as a plug-in unit. This plug-in unit being removable from another removable piece or directly from the system component frame or a housing for servicing and programming. During servicing and programming, the timing disk can be mechanically disconnected from its drive or, if this should be advantageous for specific embodiments, can remain directly engaged with the drive in that the power train between the drive and the timing disk is carried out in the manner of a pivotable angular gear. What is advantageous given such embodiments of time switch means according to the invention is that the timing disks can be relatively large in outside diameter and, thus, in the diameter of the programming scale with a diameter up to 100 mm given a so-called European format for a support plate of a plug-in unit. The relatively small spacing of the switching time of two switch jockeys neighboring one another on such a timing disk which is thereby attainable.

The simple and unproblematical servicing and programming of timing disks, constructed in accordance with the invention, in their withdrawn state is further advantageous. Further, the program scale can be easily viewed from the front side of the plug-in unit in an inserted state, since a part of the circumference is exposed exterior to the housing.

The time switch means may be in the form of a module, containing the timing disk, for installation on a plug-in unit which, if need be, can be electrically disconnected from a multipole connector or connector block at the back side of the system housing frame when it is withdrawn and programmed.

BRIEF DESCRIPTION OF THE DRAWING

FIG. 1 is a perspective view of a time switch system according to the invention including a plug-in unit which is inserted into a component housing;

FIG. 2 is the device according to FIG. 1 withdrawn for the purpose of programming;

FIG. 3 is a time switch system according to the invention as a plug-in unit which is in turn releasably seated in a module unit to permit programming;

FIG. 4 is a time switch device according to the invention in which only the timing disk is extractable; and FIG. 5 is a time switch device as a variation of FIG. 4 with a pivotable drive coupling power train between the timing disk and the drive.

DESCRIPTION OF THE PREFERRED EMBODIMENT

With reference to FIGS. 1 and 2, there is shown a component carrier housing 1 with a plug-in module unit 2 containing a time switch means 3 in the form of a switch clock. A rotatable timing disk is mounted for driven rotation in the time switch means 3. Adjustably programmable switch riders 5, which are trip cam surfaces, are selectively attached at desired points about the circumferences of the disk. Time scale markings on a front planar side 7 of the timing disk 4 are placed circumferentially about the disk. A scale comparable to that provided with the numeral 6 may also be provided along the annular side edge 8 of the timing disk 4. This scale is referenced with the numeral 9.

As can be seen from FIGS. 1 and 2, the timing disk 4 is inventively disposed perpendicularly to the lateral front plate 10 of the plug-in unit 2 rotatable about a lateral axis and has a portion protruding through a suitable opening 17 in the plate 10 exposing part of its circumference, so that the scales 6 and 9, particularly the scale 9, can be viewed exteriorly of the front plate of the plug-in unit. Thereby, it is expediently provided that the scale 9 and its chronological markings are angularly offset relative to the scale 6 and its reference marks.

By disposing the timing disk rotatable about a lateral axis, the timing disk 4 can exhibit a maximum diameter corresponding to the height of the plug-in unit 2 or, respectively, its back plate. Thus, relatively large widths are permitted for the switch riders 5 disposed on the disk circumference, and a relatively small free time space between two switch riders 5 neighboring one another is now possible.

The vertical height of the front plate 10 can be a standard 128.5 mm and the width can be 50 mm or less. The time switch means 3 is designed as a module and is seated on the back plate of the plug-in unit. The back plate supporting the time switch means 3 is designed as a part of the plug-in unit and is guided for back and forth movement in corresponding guidance tracks 12 formed in the frame of the component housing 1. Mulitipole connectors are positioned within the housing 1 for the electrical connection of the time switch means 3, particularly both for power supply for the disk drive as well as for the connections of electrical control switch contacts activated by the time switch means 3.

A star wheel 14 is provided in the time switch means 3 to be intermittently engaged or triggered by the cams of the switch riders 5 in conformity with the switching program. The time scale 6 is related to the spatial configuration of this star wheel 14, such that the time scale 6 serves not only for taking a reading but, also as a programming aid for the switch riders 5. For reading the timing disk 4 along its annular edge side, however, it is particularly the scale 9 which is used by the operator for these functions. The scale is arranged angularly offset relative to the scale 6, namely by the angle between a reference mark 15 placed at the star wheel 14 and a front reference mark 16 adjacent the opening 17 on the front plate 10 which may be made of transparent material provided there.

In order to program the timing disk 4, the plug-in unit 2 is withdrawn from the component housing along the tracks 12, as is shown in greater detail in FIG. 2. For the purpose of programming, the electrical connection at the multipole connection 13 can be disconnected. In other instances within the contemplation of the present invention as shown in FIGS. 1 and 2, the multipole connectors 13 are secured to the plug-in unit 2 and suitable elongated wire connections are provided between the multipole connectors 13 at the plug-in unit 2 and at the system housing 1.

Removability of the plug-in unit 2 for the purpose of programming the timing disk 4 is an advantage due to the relatively large timing disk 4 which is usually only re-programmed on rare occasions anyway. The running operation as well as reading time from the disk scales is apparent from the exterior front of the plug-in unit, where a relatively large circumferential range can be viewed. A handhold 18 is provided for withdrawing the plug-in unit 2. A control knob 19 is mounted on the free end of a drive axle turning the disk for manually setting the timing disk 4. The star wheel 14 can be activated by means of a suitable circuit having a mechanical contact 20 in the form of a control knob which is exteriorly mounted at the front plate. Activation of the knob 20 sets the star wheel for controlled switching by the switch riders 5. This mechanical contact 20 can directly charge the star wheel 14 or a corresponding switch wheel on the star wheel 14.

In a further embodiment of the invention shown in FIG. 3, the plug-in unit 2 is relatively large for carrying a plurality of individual system components as well as slidably receiving on suitable track means a support plate 22 for mounting the time switch means 5. The time switch means is movable in and out of the confines of the unit 2 for the purpose of programming the timing disk 4, arranged in the manner discussed above. Electrical connection between the time switch means multipole connectors and the remainder portion of the plug-in unit 2 or the system housing can be constructed for release or maintained by a suitably elongated flexible wire means.

According to a further embodiment which is shown in FIG. 4, the timing disk 4 may be alone removable for programming through the front plate 10 of the plug-in unit. The remaining elements of a time switch means 3 remain on the inserted plug-in unit 2. To this end, the timing disk can be seated on a expandable pivot or accordion bracket 23 which is horizontally movable in a transverse plane. The front opening in the plate 10 can be closed by means of a hinged glass cover 24. The timing disk 4 is formed with a gear rim 25 about its circumference. The gear rim 25 serves, in the inserted state of the timing disk 4, to engage with a rotary drive pinion 26. A knurled knob, not shown, may be provided within the unit 2 for engaging with the gear rim 25 for manually setting the timing disk 4 in its inserted state, particularly for setting the time. Alternatively, as shown in FIG. 5, the drive of the timing disk 4 may be maintained during programming or general maintenance, a mechanical power train can be maintained via a so-called pivotable angular gear 27 mounted on the accordian bracket 23. Such a gear 27 can be directly seated on the bearing accordian bracket 23 at many different places as shown.

It lies within the framework of the invention that a plug-in unit 2 or 22 can assume any random side and shape as is necessary. A plurality of timing disks 4 with cycle times which differ from one another can also be co-axially disposed with respect to one another, for example, given a switch clock for a daily and a weekly program, or for time lag relays with a plurality of timing ranges which differ from one another.

Further, the invention is not restricted only to mechanical time switch devices but also includes electronic time switch devices where a programming means can be stationarily disposed, i.e., not like a timing disk 4 as described.

It is also possible that the timing disk 4 is not removable either alone or together with a time switch means but, rather, is disposed on a plug-in unit which can be pivoted out.

Although various minor modifications may be suggested by those versed in the art, it should be understood that I wish to embody within the scope of the patent warranted hereon all such modifications as reasonably and properly come within the scope of my contribution to the art

I claim:

1. Time switch apparatus for use in a system housing in the form of a module unit being transversely removable from said housing and having a front plate for facing flush with the front of said housing, comprising a rotatable timing disk adapted for rotation in said module unit about an axis longitudinal of said housing and having time scale markings extending circumferentially about said disk said front plate having an opening through which a portion of the circumference of said disk protrudes exterior of said housing front, adjustably positionable cam riders selectively mounted along the circumference of said disk, control switch means on said module unit for being triggered by said cam riders during rotation of said disk, and mounting means for enabling transverse movement of said disk module unit away from said housing to permit adjustment of cam rider positions on said timing disk in said module unit.

2. The time switch apparatus of claim 1, wherein said time scale markings extend about the circumferential edge surface of said disk.

3. The time switch apparatus of claim 1, wherein said mounting means includes transverse track portions in said housing and a support plate on said module unit slidably received in said track portions.

4. The time switch apparatus of claim 3, wherein said control switch means includes electrical connector means for mating with power supply means in said housing, said electrical connector means disconnecting from said power supply means when said timing disk is withdrawn from said housing.

5. The time switch apparatus of claim 1, wherein said timing disk and control switch means are mounted together as a further module portion in said module unit.

6. The time switch apparatus of claim 5, wherein said control switch means includes electrical connector means for mating with power supply means in said housing, said electrical connector means disconnecting from said power supply means when said timing disk is withdrawn from said housing.

7. Time switch apparatus for use in a system housing in the form of a module unit being transversely removable from said housing and having a front plate for facing flush with the front of said housing, comprising a rotatable timing disk adapted for rotation on said module unit about an axis longitudinal of said housing and having time scale markings extending circumferentially about said disk, adjustably positionable cam riders selectively mounted along the circumference of said disk, control switch means on said module unit for being triggered by said cam riders during rotation of said disk, and mounting means for enabling transverse movement of said disk away from said housing to permit programming of said timing disk including extendible hinged bracket means disposed on said module unit for enabling transverse movement of said timing disk relative to said module unit and said control switch means.

8. The time switch apparatus of claim 7, wherein said front plate has an opening through which a portion of the circumference of said disk protrudes exterior of said housing front.

9. The time switch apparatus of claim 8, wherein said time scale markings extend about the circumferential edge surface of said disk.

* * * * *